United States Patent
James et al.

(10) Patent No.: US 6,518,678 B2
(45) Date of Patent: Feb. 11, 2003

(54) APPARATUS AND METHOD FOR REDUCING INTERPOSER COMPRESSION DURING MOLDING PROCESS

(75) Inventors: Stephen L. James, Boise, ID (US); Brad D. Rumsey, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/749,872

(22) Filed: Dec. 29, 2000

(65) Prior Publication Data

US 2002/0084538 A1 Jul. 4, 2002

(51) Int. Cl.⁷ .................... H01L 23/28; H01L 23/02
(52) U.S. Cl. ............. 257/787; 257/678; 257/789; 257/793
(58) Field of Search .................. 257/678, 787, 257/698, 774, 789, 793, 798; 438/106, 121, 112, 124, 127

(56) References Cited

U.S. PATENT DOCUMENTS

| | | | | |
|---|---|---|---|---|
| 6,030,854 A | * | 2/2000 | Mashimoto et al. | 438/106 |
| 6,097,089 A | * | 8/2000 | Gaku et al. | 257/712 |
| 6,225,694 B1 | * | 5/2001 | Terui | 257/704 |
| 6,292,370 B1 | * | 9/2001 | Anderson et al. | 361/748 |

FOREIGN PATENT DOCUMENTS

JP  10-270600  * 10/1998  ......... H01L/23/538

* cited by examiner

*Primary Examiner*—Jasmine J B Clark
(74) *Attorney, Agent, or Firm*—Dickstein Shapiro Morin & Oshinsky (57) ABSTRACT

A method for inhibiting damage caused to semiconductor die packages during a molding process, and the semiconductor die packages formed therefrom, is described. One or more openings are provided in a die carrier which are filled with a material which is more resistant to compressive forces than the carrier.

53 Claims, 6 Drawing Sheets

APPARATUS AND METHOD FOR REDUCING INTERPOSER COMPRESSION DURING MOLDING PROCESS

FIELD OF THE INVENTION

The invention generally relates to the packaging of semiconductor chips, and more particularly to inhibiting damage to semiconductor chip packaging structures during package molding.

BACKGROUND

The fabrication of packaged semiconductor chips or dies is well known. One conventional ball grid array (BGA) packaging method includes affixing a fabricated die to a substrate and electrically connecting the die to conductive leads on the substrate. The electrical connection may be through wire bonding or other known connection techniques which couples bond pads on the die to corresponding leads on the substrate. A plastic molding material is then typically applied to the die and substrate for encapsulating the die on the substrate. Exposed contacts on the substrate connected to the conductive leads are used to electrically connect the packaged die to a circuit board. The molding material is typically applied by placing the die and substrate in a mold and injecting molding material over the die and substrate and exerting a force by way of a mold clamping mechanism.

A recurrent problem associated with the molding process is that the force applied to the substrate during molding is often greater than the ability of the substrate to resist compression, and thus the force exerted on the die and substrate often damages the delicate wiring and/or the contacts on the substrate, thereby destroying the viability of the packaged product. Further, the compressive forces encountered during molding may cause distortion of the substrate which in turn causes the plastic encapsulation material to leak onto undesired areas of the substrate, producing a defective package for the die.

Figure 1:
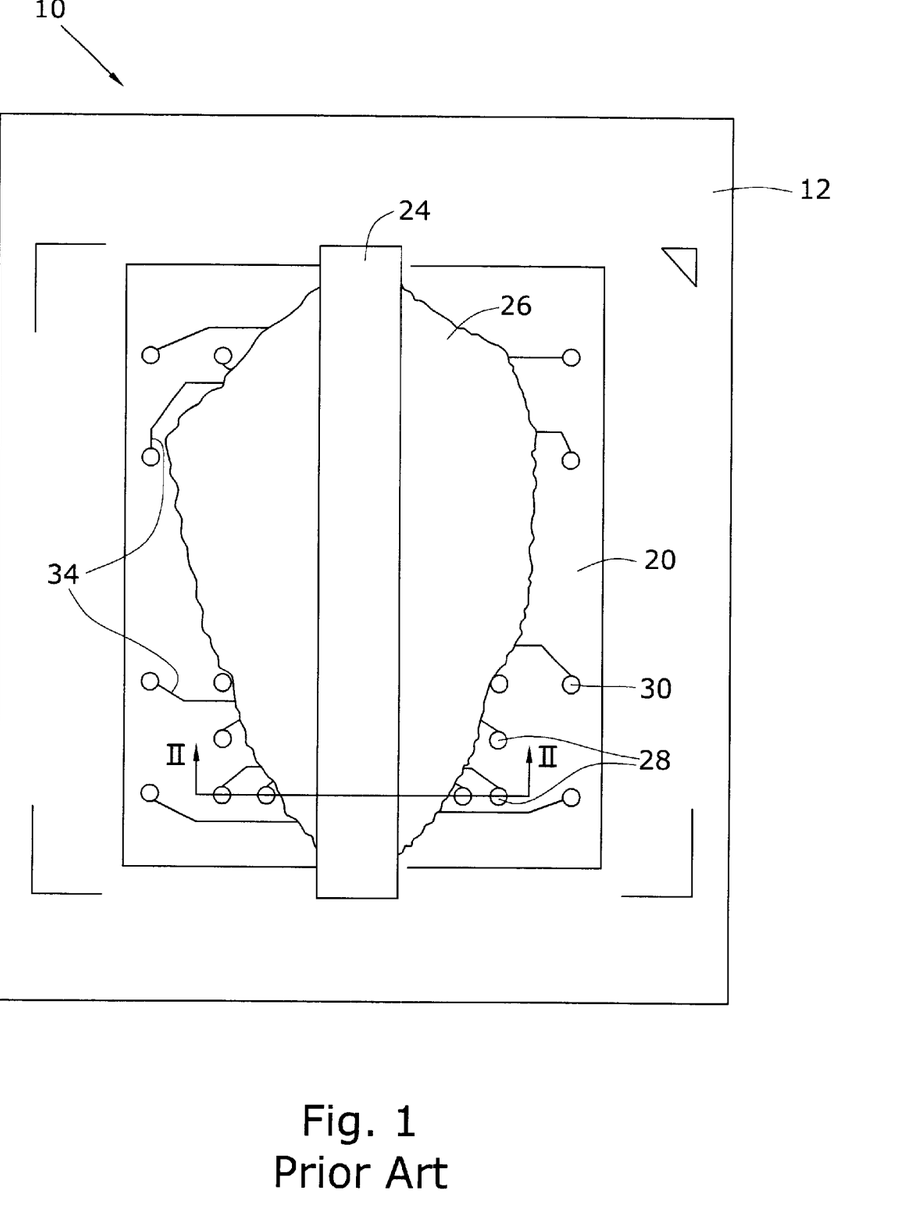
FIG. 1 is a top view of a conventionally fabricated semiconductor die package.
Figure 2:
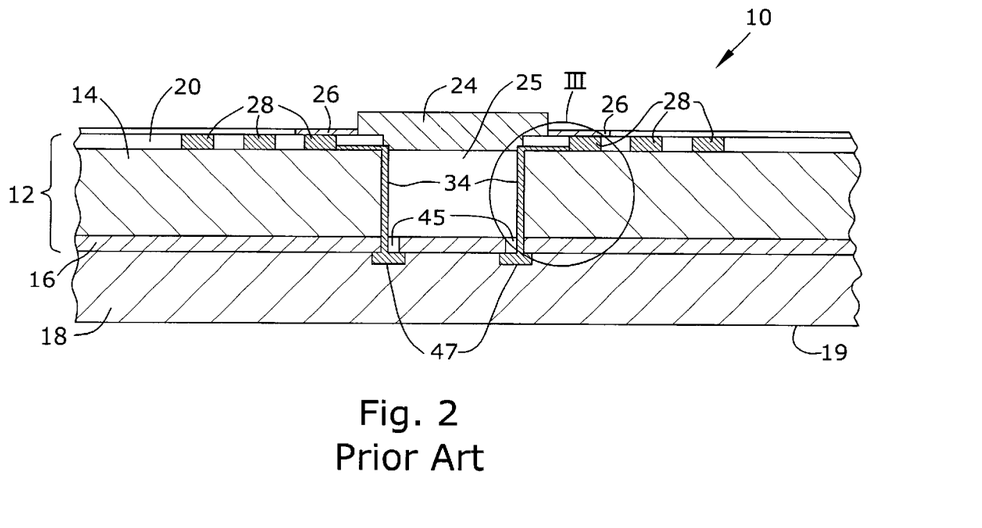
FIG. 2 is a cross-sectional view taken along line II—II of the semiconductor die package of FIG. 1.
Figure 3:
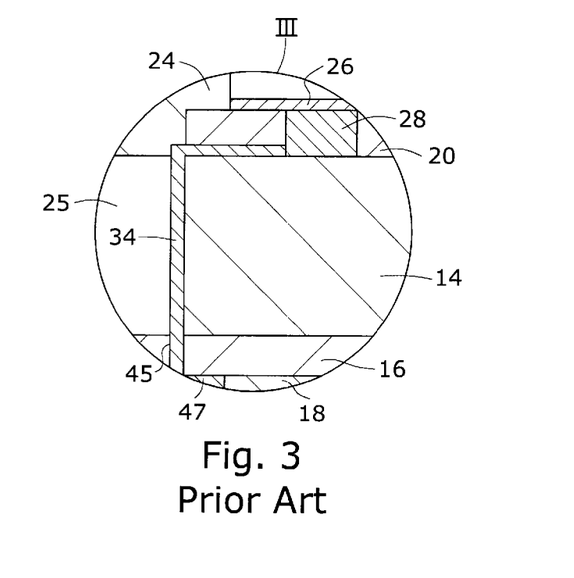
FIG. 3 is a close-up view taken within circle III of the semiconductor die package FIG. 2.

A conventionally fabricated BGA semiconductor die package 10 is shown in FIGS. 1–3. The package 10 includes a die carrier 12 which includes an interposer layer or substrate 14 and a first solder mask layer 16, which isolates areas of the substrate 14 that are to be bonded to a die 18 supported by the carrier 12. The substrate 14 has a trench 25 (FIGS. 2–3) to allow conductive leads 34 formed on the substrate 14 to interconnect with bond pads 47 on the die 18. These conductive leads 34 are connected with conductive traces on the substrate 14, which in turn connect with external contacts 28. The die 18 is positioned on a surface of the first solder resist layer 16 and has bond pads 47 which connect with respective conductive leads 34 through conductively lined holes 45 provided in the solder mask 16. The die carrier 12 is diced from a carrier strip, which may include up to twelve separable die carriers. Alternatively, the die carrier may be diced from a carrier matrix, which may include numerous rows and columns of separable die carriers.

Most substrates 14 are formed of either a glass weave reinforced resin or a tape. A second solder mask 20 is provided on a surface 15 of the substrate 14, leaving exposed the contacts 28 and shielding the conductive leads 34 running along the surface 15 from the contacts 28 to the centrally-located trench 25. Specifically, located on a surface 15 of the substrate 14 and exposed by openings within the second solder mask layer 20 are the plurality of contacts 28 which will have solder balls screen printed thereon for use in connecting the die package 10, after package molding, to a printed circuit board. Wiring in the form of the conductive leads 34 is shown extending into the trench 25 to contacts 45 provided in holes in the first solder mask layer 16 to bond pads 47 of the die 18. Some of the contacts 28 may be formed as openings, such as openings 30 extending through the substrate 14. After molding, a mold material strip 24 fills the trench 25 on one side of the substrate 14 and provides protection to the wiring 34 extending into the trench 25 to the die 18. The mold material 24 also covers the die 18 and extends slightly outwardly thereof onto the substrate 14. The mold material 24 is only partly shown in FIG. 2 for clarity of illustration.

When a mold material, such as the mold material 24 (FIGS. 1–3), is applied to the die 18, the substrate 14, and both solder resist layers 16, 20 by injection into a mold cavity, a force is exerted on the surface 19 of the die 18. This causes a compressive force to be exerted down on the substrate 14 squeezing together its opposite surfaces. These compressive forces may destroy the wiring 34 on each surface of the substrate 14, rendering the packaged product useless. Further, these compressive forces may also cause the mold material strip 24 to weep over the solder mask 20, creating an undesirable mold material mass 26 (FIG. 1) which may cover one or more of the contacts 28, again rendering the packaged product useless.

SUMMARY

In one aspect, the invention provides a semiconductor die carrier which includes a substrate which has greater resistance to compressive forces. The substrate includes holes extending therethrough which are filled with a material which has a greater resistance to compressive forces than the substrate itself, thereby reducing the possibility of a defective product being produced by compression of the substrate during package molding.

In another aspect, the invention further provides a method of fabricating a semiconductor die package. The method includes forming a substrate having a plurality of holes extending therethrough, filling the plurality of holes with a material which has a greater resistance to compressive forces than the substrate, attaching a die to the substrate, and encapsulating the die and a portion of the substrate with a mold material.

These and other advantages and features of the invention will be more readily understood from the following detailed description of the invention which is provided in connection with the accompanying drawings.

DETAILED DESCRIPTION OF PREFERRED EMBODIMENTS

Figure 4:
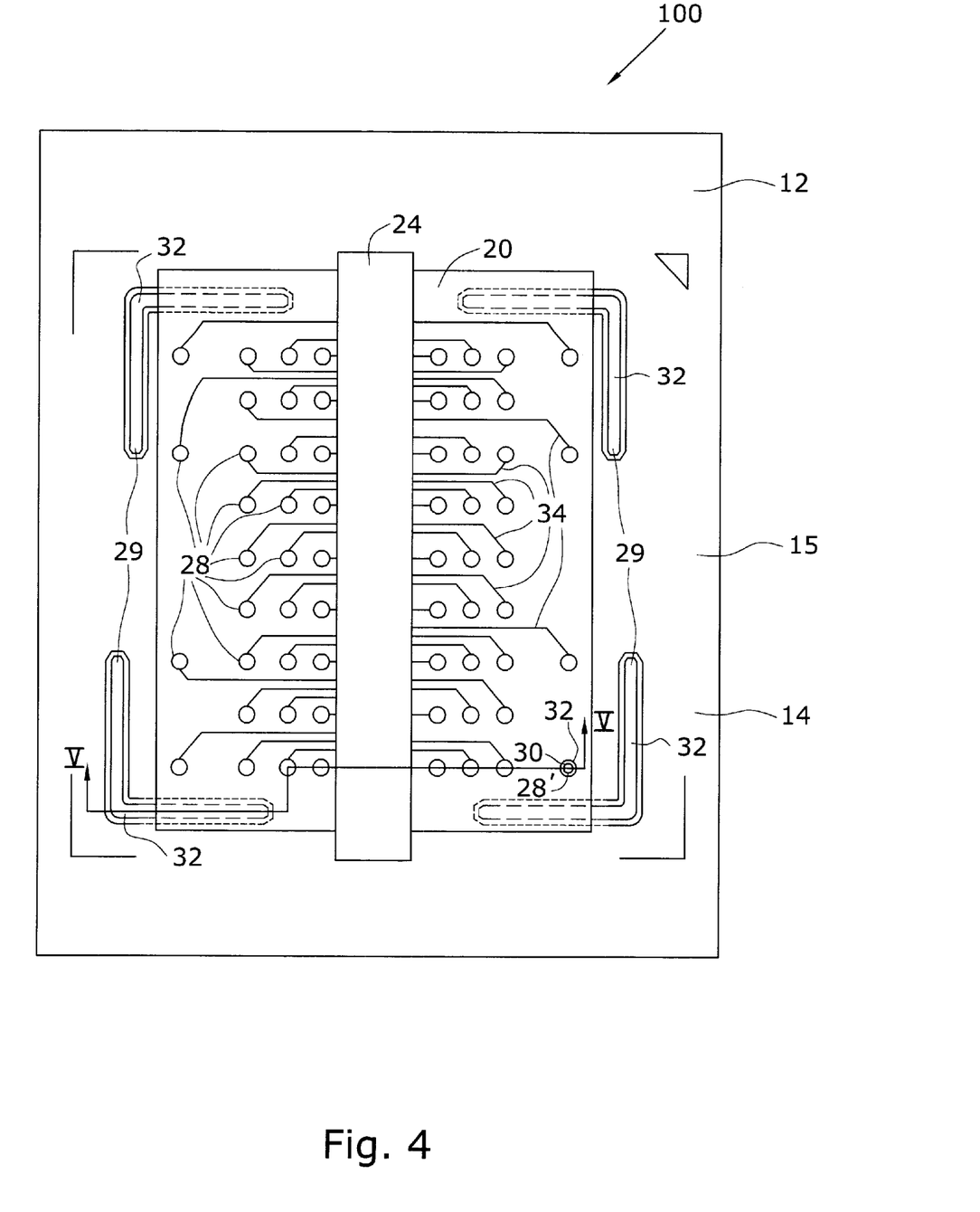
FIG. 4 is a top view of a semiconductor die package constructed in accordance with an embodiment of the invention.
Figure 5:
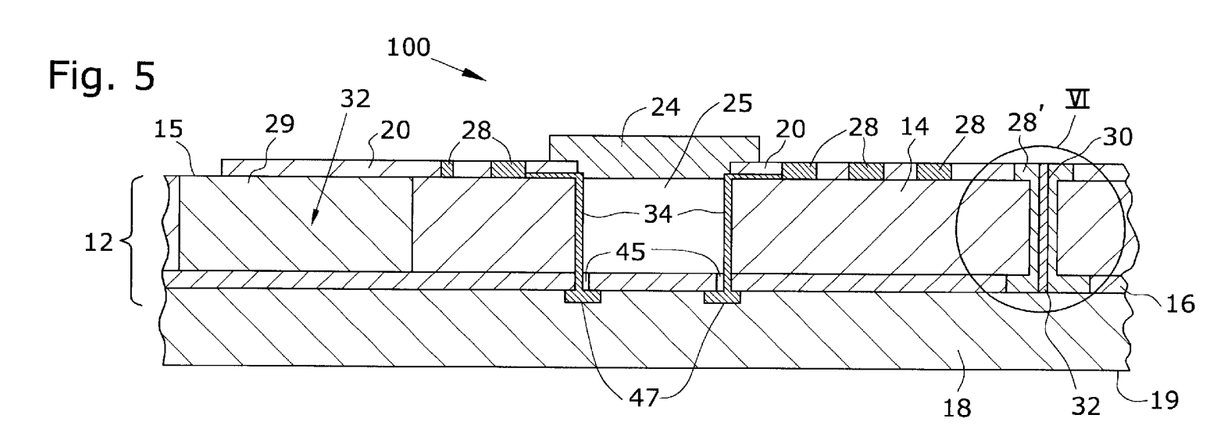
FIG. 5 is a cross-sectional view taken along line V—V of the semiconductor die package of FIG. 4.
Figure 6:
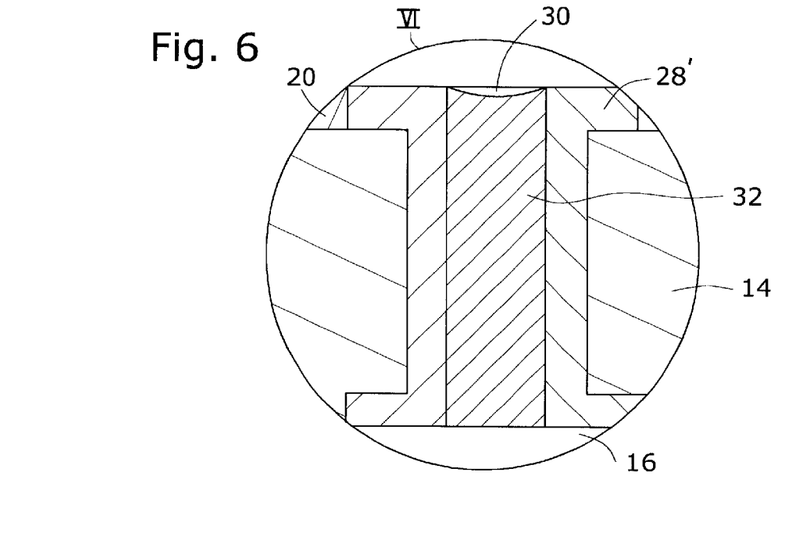
FIG. 6 is a close-up view taken within circle VI of the semiconductor die package of FIG. 5.

FIGS. 4–6 illustrate a semiconductor package 100 fabricated in accordance with an embodiment of the invention. The package 100 has a die carrier 12 which includes an interposer layer or substrate 14 having wiring traces on a surface thereof, and a first solder mask layer 16 which covers the wiring traces. The die carrier 12 may be diced from a carrier strip, which may include up to twelve separable die carriers, or alternatively, the die carrier may be diced from a carrier matrix, which may include numerous rows and columns of separable die carriers. A die 18 is attached to a surface of the solder mask layer 16, preferably with an adhesive (FIG. 5). The substrate 14 typically comprises a glass weave impregnated with a resin, such as BT resin, although any suitable die support material, such as, for example, a tape may be used.

A second solder mask layer 20 is positioned on a surface 15 of the substrate 14, leaving the contacts 28 exposed. The solder mask layer 20 covers conductive leads or wiring 34 on the upper surface 15 except where the contacts 28 are located. The wiring 34 on the upper surface 15 of the interposer layer 14 extends into a trench 25 where connections are made to bond pads 47 on the die 18 through connectors 45. At least one, and preferably a plurality, of supports 28' extend through the solder mask layer 20 and the substrate 14. Each support 28' includes a via 30 which may comprise a conductive material of, e.g. copper, though any conductor can be used. Also, the via 30 does not have to include a conductor therein.

To inhibit damage to the substrate 14, solder masks 16, 20, the wiring 34, and the contacts 28 and/or to inhibit weeping of molding material onto contacts 28 caused by compression, a material 32 having a higher resistance to compression than the material of the substrate 14 is placed within selected vias 30. In lieu of, or in addition to, placing the compression resistant material 32 within the vias 30, slots 29 formed within and extending through the substrate 14 and/or solder mask 20 may include the compression resistant material 32. As illustrated in FIG. 4, the slots 29 are L-shaped, although slots or openings of any suitable shape may be utilized.

The compression resistant material 32 has as a defining characteristic a greater resistance to compression than at least the material of the substrate 14 and preferably the solder resist layers 16 and 20 as well, and more preferably, a resistance which will withstand the clamping force exerted during the molding process. The compression resistant material 32 may also have a lower moisture absorption coefficient, a higher glassy temperature ($T_g$) and a lower coefficient of thermal expansion (CTE) than the material of the substrate 14 and the solder resist layers 16 and 20. The higher glassy temperature $T_g$ is a limited temperature range at which a material changes from a flexible/pliable state to a solid. In this temperature range, the material's CTE also changes.

Preferably, an epoxy including filler particles is used for the compression resistant material 32. One suitable epoxy, manufactured by Sumitomo, is commercially available as PHP-900. Four separate versions of the PHP-900 material are suitable as the compression resistant material 32. The versions IR-1 and IR-6 are thermal cure epoxies. The versions DC3 and DC5–4 are ultraviolet and thermal cure epoxies. Other suitable materials for the plug material 32 include HBI-2000, manufactured by Taiyo, and Hitachi Chemical's MCF6000E. Suitable filler particles include silica.

The compression resistant material 32 should fill the interior space of the vias 30 and/or slots 29 to such an extent that substrate damage and mold material leakage due to mold compression is mitigated. The compression resistant material 32 may entirely fill or only partially fill the vias 30 and/or the slots 29.

Figure 8:
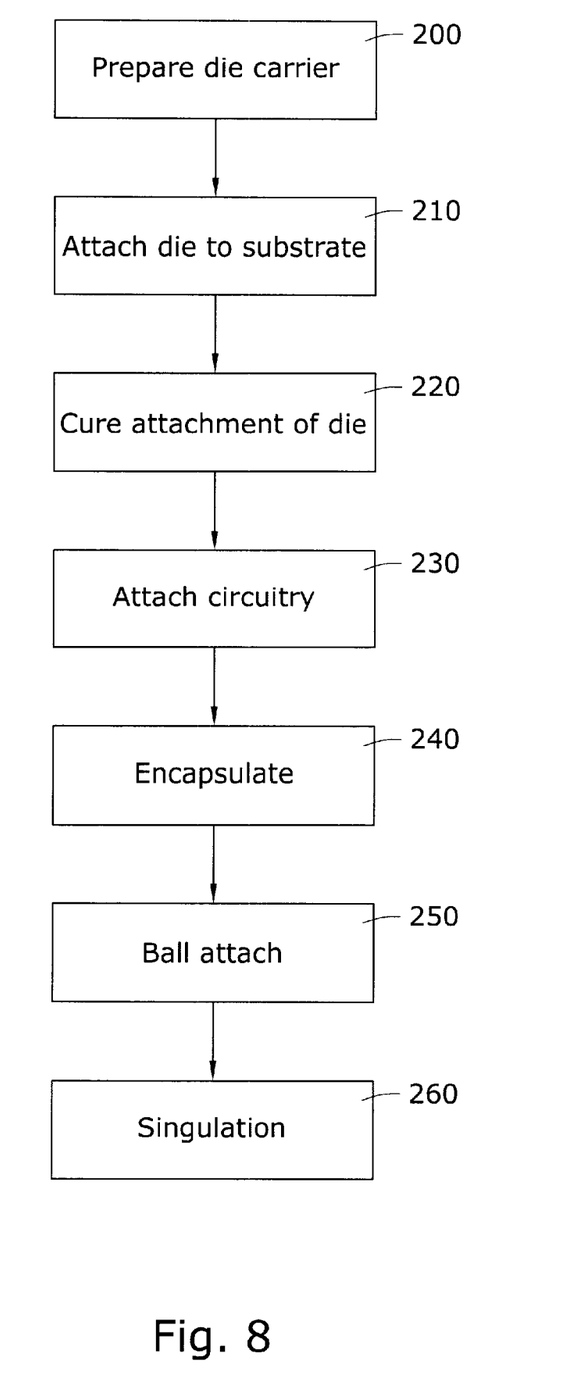
FIG. 8 is a flow diagram of a method for fabricating a semiconductor chip in accordance with an embodiment of the invention.

With specific reference to FIG. 8, next will be described one exemplary processing sequence for fabricating the semiconductor die package 100. At step 200, the die carrier 12 is fabricated, including preparation of the contacts 28, supports 28', slots 29 (if used), and vias 30. The supports 28' and the optional slots 29 also include the compression resistant material 32 which inhibits compression of the substrate 14. At step 210, the die 18 is attached to the die carrier 12. The die 18 is preferably attached to the chip carrier 12 with an adhesive. At step 220, the adhesive attaching the die 18 to the carrier 12 and the die 18 is cured. At step 230, the wiring 34 is attached between the contacts 28 and 30, if used, and respective contacts, e.g. 47, on an opposing surface of the substrate 14. The die 18 is then encapsulated within the molding material 24 at step 240. Balls are attached to the contacts 28 at step 250, and at step 260 die carriers 12 within a carrier strip or matrix are singulated.

Figure 7:
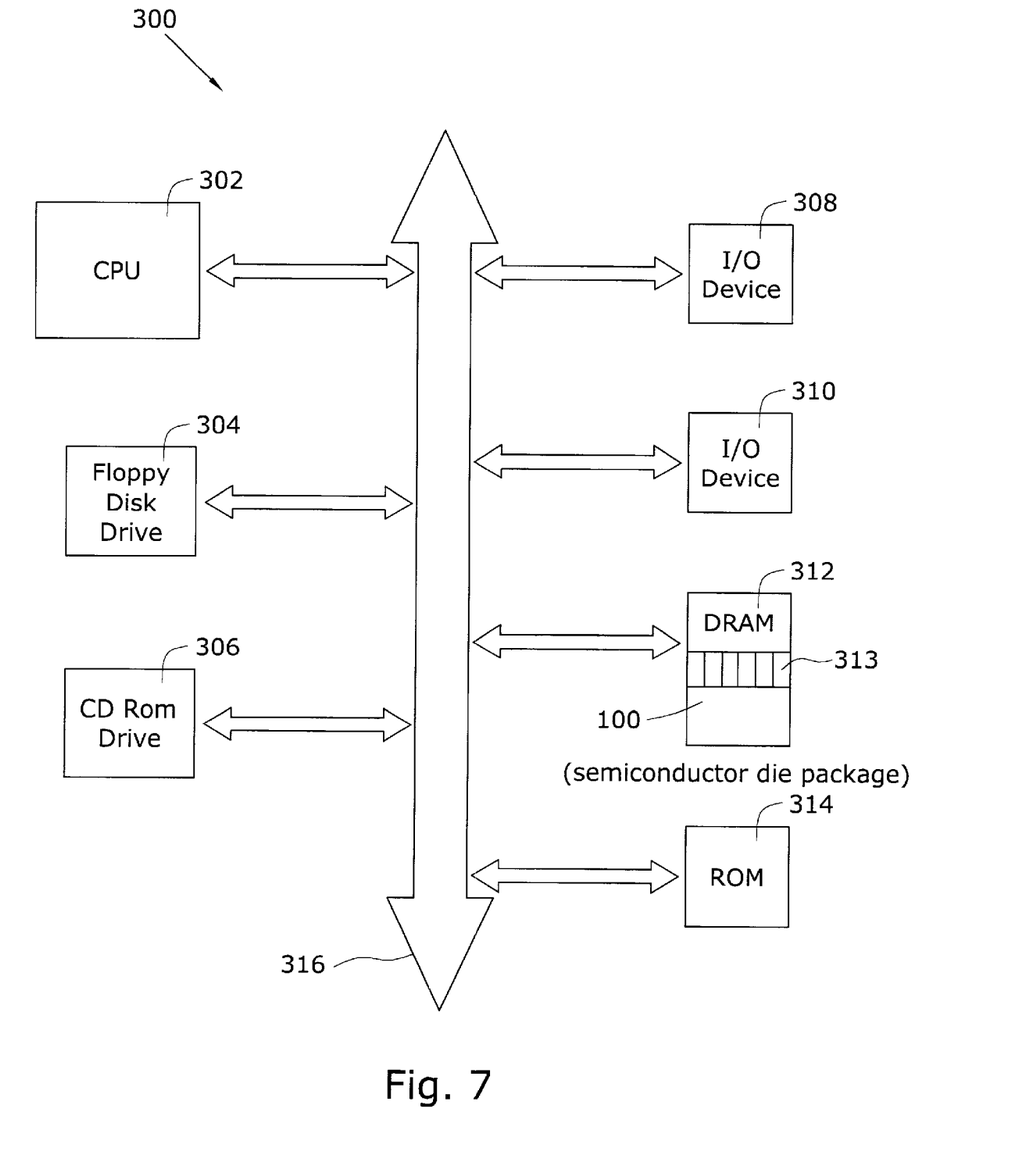
FIG. 7 illustrates a processor-based system constructed in accordance with an embodiment of the invention.

Referring now to FIG. 7, a semiconductor die package 100 constructed in accordance with the invention can be used to package a memory circuit, such as a DRAM device 312, or any other electronic integrated circuit, for use within a processor-based system 300. The processor-based system 300 may be a computer system, a process control system or any other system employing a processor and associated memory. The system 300 includes a central processing unit (CPU) 302, which may be a microprocessor. The CPU 302 communicates with the DRAM device 312, which has memory cells 313, over a bus 316. The DRAM 312 package 100 is as described above with reference to FIGS. 4–6. The CPU 302 further communicates with one or more I/O devices 308, 310 over the bus 316. Although illustrated as a single bus, the bus 316 may be a series of buses and bridges commonly used in a processor-based system. Further components of the system 300 may include a read only memory (ROM) device 314 and peripheral devices such as a floppy disk drive 304, and CD-ROM drive 306. The floppy disk drive 304 and CD-ROM drive 306 communicate with the CPU 302 over the bus 316. As noted, any of the electronic elements of FIG. 6 which are packaged as an integrated circuit may also employ the packaging structure and method of the invention, including but not limited to the central processing unit 302.

The invention provides a semiconductor chip with enhanced compression resistant capabilities. The invention further provides a method for fabricating such a semiconductor chip.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor device packaging structure, comprising:
   a substrate containing a wiring pattern and a location for mounting a die for connection with said wiring pattern;
   said substrate containing at least one opening extending at least partially into said substrate; and
   a material positioned within said opening, said material having a greater resistance to compressive forces than said substrate.

2. The semiconductor device packaging structure of claim 1, wherein said opening is a hole.

3. The semiconductor device packaging structure of claim 1, wherein said hole is a slot.

4. The semiconductor device packaging structure of claim 1, further including a solder mask positioned on a surface of said substrate, said solder mask exposing portions of said wiring pattern for allowing electrical connections to said wiring pattern.

5. The semiconductor device packaging structure of claim 1, wherein said opening extends completely through said substrate.

6. The semiconductor device packaging structure of claim 1, wherein said material comprises an epoxy.

7. The semiconductor device packaging structure of claim 1, further comprising a mold material encapsulating a portion of said structure.

8. The semiconductor device packaging structure of claim 1, wherein said substrate comprises a glass weave resin.

9. The semiconductor device packaging structure of claim 1, wherein said substrate comprises a tape.

10. The semiconductor device packaging structure of claim 4, wherein said opening extends through said solder mask.

11. The semiconductor device packaging structure of claim 5, wherein said opening has sidewalls lined with a conductive material.

12. The semiconductor device packaging structure of claim 11, wherein said conductive material comprises copper.

13. The semiconductor device packaging structure of claim 11, wherein said opening is a via.

14. The semiconductor device packaging structure of claim 6, wherein said epoxy contains particles.

15. The semiconductor device packaging structure of claim 14, wherein said particles comprise silica.

16. A packaged semiconductor die, comprising:
   a die;
   a substrate mounting said die, said substrate comprising an interposer layer;
   a plurality of openings in said interposer layer;
   wiring supported by said interposer layer, said wiring connected to electrical terminals on said die;
   a material positioned within said plurality of openings, said material having a greater resistance to compressive forces than said interposer layer; and
   a molding material which secures said die to said substrate.

17. The packaged semiconductor die of claim 16, further comprising a first solder mask positioned on a first surface of said interposer layer.

18. The packaged semiconductor die of claim 16, wherein at least one of said plurality of openings forms part of a conductive via which extends through said interposer layer.

19. The packaged semiconductor die of claim 16, wherein at least one of said plurality of openings extend partially through said interposer layer.

20. The packaged semiconductor die of claim 16, wherein at least one of said plurality of openings extend completely through said interposer layer.

21. The packaged semiconductor die of claim 16, wherein at least one of said plurality of openings has a circular cross-section.

22. The packaged semiconductor die of claim 16, wherein at least one of said plurality of openings comprises a slot.

23. The packaged semiconductor die of claim 16, wherein said material comprises an epoxy.

24. The packaged semiconductor die of claim 16, wherein said interposer layer comprises a glass weave resin.

25. The packaged semiconductor die of claim 16, wherein said interposer layer comprises a tape.

26. The packaged semiconductor die of claim 16, wherein said die comprises a memory device.

27. The packaged semiconductor die of claim 17, further comprising a second solder mask layer between said die and a second surface of said interposer layer, wherein at least one of said plurality of openings extends through at least one of said solder mask layers.

28. The packaged semiconductor die of claim 27, wherein at least one said plurality of openings extends through both said solder mask layers and said interposer layer.

29. The packaged semiconductor die of claim 18, wherein said conductive via comprises sidewalls lined with a conductive material.

30. The packaged semiconductor die of claim 29, wherein said conductive material comprises copper.

31. The packaged semiconductor die of claim 22, wherein said slot is L-shaped.

32. A processor-based system, comprising:
   a processing unit; and
   an integrated circuit device coupled to said processing unit, at least one of said processing unit and integrated circuit device comprising a packaged semiconductor die, said packaged semiconductor die comprising:
      a substrate containing a wiring pattern and a location for mounting a die for connection with said wiring pattern, said substrate containing at least one opening extending at least partially into said substrate;
      a die mounted at said die location; and
      a material positioned within said opening, said material having
   a greater resistance to compressive forces than said substrate.

33. The system of claim 32, wherein said die contains said processing unit.

34. The system of claim 32, wherein said die contains said integrated circuit device.

35. The system of claim 34, wherein said integrated circuit device comprises a memory device.

36. The system of claim 32, further including a solder mask positioned on a surface of said substrate.

37. The system of claim 32, wherein said opening extends completely through said substrate.

38. The system of claim 32, wherein said material comprises an epoxy.

39. The system of claim 32, further comprising a mold material encapsulating a portion of said structure.

40. The system of claim 36, wherein said opening extends through said solder mask.

41. The system of claim 37, wherein said opening has sidewalls lined with a conductive material.

42. The system of claim 41, wherein said conductive material comprises copper.

43. The system of claim 38, wherein said epoxy contains particles.

44. The system of claim 43, wherein said particles comprise silica.

45. A method of packaging a semiconductor die, comprising:
   (a) attaching a die to a semiconductor chip carrier, said carrier including a plurality of openings, at least one of said plurality of openings including a compression resistant material having a greater resistance to compressive forces than said carrier; and
   (b) encapsulating said die and at least a portion of said carrier with a mold material.

46. The method of claim 45, further comprising electrically connecting said die to a wiring pattern on said carrier.

47. The method of claim 46, wherein said wiring pattern comprises a printed wiring pattern.

48. The method of claim 45, wherein said opening is a via, said compression resistant material being surrounded by said conductive lining.

49. The method of claim 45, wherein said opening comprises a slot.

50. The method of claim 45, wherein said opening extends at least partially through said carrier.

51. The method of claim 48, wherein said via comtains a conductive lining on sidewalls of the via.

52. The method of claim 49, wherein said slot is an L-shaped slot.

53. The method of claim 50, wherein said opening extends through said carrier.

* * * * *